US007274352B2

(12) United States Patent
Yu

(10) Patent No.: US 7,274,352 B2
(45) Date of Patent: Sep. 25, 2007

(54) COMBINING DETECTION CIRCUIT FOR A DISPLAY PANEL

(75) Inventor: Chih-Lung Yu, Tainan County (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 687 days.

(21) Appl. No.: 10/778,539

(22) Filed: Feb. 17, 2004

(65) Prior Publication Data

US 2005/0046439 A1 Mar. 3, 2005

(30) Foreign Application Priority Data

Aug. 26, 2003 (TW) .............................. 92123496 A

(51) Int. Cl.
*G09G 3/36* (2006.01)
*G01R 31/08* (2006.01)
*G01R 31/00* (2006.01)

(52) U.S. Cl. ........................ 345/100; 345/98; 324/770; 324/527

(58) Field of Classification Search .......... 345/87-100, 345/204-214; 324/770, 522-528
See application file for complete search history.

(56) References Cited

U.S. PATENT DOCUMENTS 6,013,923 A * 1/2000 Huang ........................ 257/59
6,020,599 A 2/2000 Yeo
6,025,891 A 2/2000 Kim
6,084,648 A 7/2000 Yeo
6,100,949 A 8/2000 Kim
6,128,051 A 10/2000 Kim et al.
6,392,719 B2 5/2002 Kim
6,400,425 B1 6/2002 Kim et al.
6,566,902 B2 * 5/2003 Kwon et al. ................ 324/770
6,784,862 B2 * 8/2004 Kodate et al. ................ 345/92
6,839,121 B2 * 1/2005 Kim et al. .................. 324/770
2002/0140650 A1 * 10/2002 Kai et al. ...................... 345/87
2003/0210359 A1 * 11/2003 Lee et al. ...................... 349/43
2006/0077162 A1 * 4/2006 Chou et al. .................... 345/92

FOREIGN PATENT DOCUMENTS

JP 06-148688 5/1994
KR 200-0011657 2/2000

* cited by examiner

*Primary Examiner*—David L. Lewis
(74) *Attorney, Agent, or Firm*—Jianq Chyun IP Office

(57) ABSTRACT

The present invention relates to a combining detection circuit for a flat panel display, which applies a combination circuit to detect the layout of a liquid crystal display thin film transistor array (LCD TFT array) manufacturing process. This method uses a plurality of switches and connection wires for directing in a short-ring layout and a shorting-bar layout so that when designing the layout, the panel manufacturer will not be limited to the detection facility. Therefore, the detection for any layout facility can be amply applied and the switches are used for freely switching the various detection methods so as to increase the yield and decrease the cost.

9 Claims, 7 Drawing Sheets

COMBINING DETECTION CIRCUIT FOR A DISPLAY PANEL

BACKGROUND OF THE INVENTION

This Nonprovisional application claims priority under 35 U.S.C. § 119(a) on patent application Nos. 092123496 filed in TAIWAN on Aug. 26, 2003, the entire contents of which are hereby incorporated by reference.

1. Field of the Invention

The present invention relates to a combination circuit for detecting the layout in a flat panel with thin film transistor processed during array manufacturing process. This method conducts in a prior art short-ring layout and shorting-bar layout so that the designing of the panel layout will not limited to the detection facility so as to promote the yield and reduce the cost.

2. Description of the Prior Art

Presently, after the liquid crystal display (LCD) panel is manufactured, a detection process is required to detect whether the operation of each of the thin film transistors in the display panel for controlling the pixel display is correct or not. The detection circuit layout surrounding the panel has to meet the form of the detection facility. The commonly applied detection circuit layout comprises the short-ring layout and the shorting-bar layout.

Because the layouts for the two facilities are different, the masks for the manufacturing processes are different so as to make it difficult to meet the yield of the array manufacturing process. Usually, because the types of the layouts designed by the panel manufacturers are different, such as the different sizes, resolutions, different array detection facilities have to be switched. This makes the panel design troublesome and increases the cost for buying the detection facility in order to meet different types of the layouts. The following is the detailed description for the two types of layouts.

Please refer to FIG. 1A. FIG. 1A is a perspective diagram of a circuit of a prior art with short-ring layout. The figure shows a display device with array layout for a liquid crystal display panel. The panel is formed by pulling a plurality of scan lines 13 and data lines 14 from a gate driver G and a data driver D to be interlaced and vertical to each other. The thin film transistors 11 for controlling the pixel display are positioned on the interlaced portions of the scan lines 13 and the data lines 14. The scan lines 13 processes storage capacitances 12 which is constructed with CS ON GATE manner. The pixel display is controlled by the charging/discharging of the storage capacitances 12. In order to detect the correctness of the devices connected to the thin film transistors 11 and the surrounding layout, the plurality of scan lines 13 and the data lines 14 are connected to the external detection facility. As shown in the figure, the plurality of scan lines 13 are connected to a plurality of gate end contact pads 15*a*, and the plurality of data lines 14 are connected to a plurality of data end contacting polar plates 15*b*. The plurality of contact pads 15*a*, 15*b* are IC signal inputting points for being the positions to be in touch with the probe of the detection facility so as to detect whether each of the display device is fine. The plurality of gate end contact pads 15*a* and the data end contact pads 15*b* are connected to the shorting-ring 17 via a plurality of resistances 16. The detected data Of each display devices from probe is contacted so as to determine the yield. After accomplishing the detection for the panel, the next manufacturing process is performed. By cutting along the direction of the panel cutting line 18, the next step of the manufacturing process is continued.

As shown in FIG. 1B, which is a perspective diagram of a partial circuit of the prior art with short-ring layout, the scan lines 13 or the data lines 14 are connected to a plurality of contact pads 15*a*, 15*b*. The probe 19 of the detection facility is in touch with the contact pads 15*a*, 15*b*. By using the resistances 16, the larger static electricity is spread to each of the scan lines 13 or the data lines 14 so as to prevent the panel pixel from being damaged by the static electricity.

Please refer to FIG. 2A. FIG. 2A is a perspective diagram of a circuit of a prior art with shorting-bar layout. As FIG. 1A, FIG. 2A shows a display device array layout for a liquid crystal display panel. The panel is formed by pulling out a plurality of scan lines 13 and the data lines 14 from the gate driver G and the data driver D to be vertically interlaced. The thin film transistors 11 for controlling the pixel display are positioned on the interlaced portions. The pixel display is controlled by the charging/discharging of the storage capacitances 12. The detection method for the shorting-bar layout does not apply the probe detection. In order to detect the correctness of the devices connected to thin film transistors 11 and the surrounding layout, the plurality of scan lines 13 and the data lines 14 separately have the circuits to be connected to the external detection facility. As show in the figure, the plurality of scan lines 13 are connected to the plurality of gate end contact pads 15*a*, and the plurality of data lines 14 are connected to the plurality of data end contact pads 15*b*. The plurality of polar plates 15*a*, 15*b* are separately connected to a plurality of short-ring of the external substrate circuit. The neighboring two contact pads are separately connected to the different short-ring.

As shown in the figure, the gate end contact pads 15*a* are the plurality of contact pads connected to the scan lines 13 of the gate driver G in the panel. The neighboring two contact pads are separately connected to the odd gate line 23 and the even gate line 24. The terminals are separately connected to the odd gate end G1 and the even gate end G2. Similarly, the data lines 14 are connected to the plurality of data end contact pads 15*b*. The neighboring contact pads are separately connected to the odd data line 21 and the even data line 22. The terminals of the conducting wires are connected to the odd data end D1 and the even data end D2. The circuit of this shorting-bar layout applies the odd data end D1, the even data end D2, the odd gate end G1 and the even gate end G2 for inputting the signals to the pixels so as to detect whether the display device inside the panel is operated well. After the detection for the panel is accomplished, by cutting along the direction of the panel division line 18, the next step of the manufacturing process is continuously performed.

Please refer to FIG. 2B. FIG. 2B is a perspective diagram of a partial circuit of the prior art shorting-bar layout. FIG. 2B is a partial circuit of the gate driver G in FIG. 2A. The plurality of scan lines 13 are connected to the plurality of gate end contact pads 15*a*. The neighboring two contact pads form odd/even contact pads distributions to be separately connected to the odd gate line 23 and the even gate line 24. The odd gate end G1 and the even gate end G2 are positioned on the terminals to be separately connected to the detection signals transmitted by the odd end contact pads and the even end contact pads. When practically carrying out, it is not limited to separate the circuit into two banks. In order to increase the efficiency of the detection, the circuit can be separated into a plurality of banks. Therefore, a plurality of conducting wires are positioned for transmitting a plurality of banks of contact pads signals to the terminals for detection.

The two mentioned prior art detection methods are different, and therefore, the layout design for the panel will be different because of the usage of the different detection methods, and the layout will be limited. In addition, because of the different layouts, the different masks have to be switched and bought so as to increase the cost. Therefore, the present invention combines the two detection circuits, and therefore, the prior art with short-ring layout and the shorting-bar layout can be conducted into the manufacturing process so that the designing of the panel layout will not be limited to the detection facility. Besides, the advantages and the disadvantages of the different detection methods can be compared so that the suggestions can be provided to the facility manufacturer for improvement. Therefore, the yield can be increased and the cost can be reduced.

SUMMARY OF THE INVENTION

The present invention relates to a combining detection circuit for a display panel applying a combination circuit to detect the layout of the display panel thin film transistor array manufacturing process. The present invention uses a plurality of switches and connection wires for directing in a short-ring layout and a shorting-bar layout so that when designing the layout, the panel manufacturer will not be limited to the detection facility. Therefore, the detection for any layout facility can be applied and the switches are used for freely switching the various detection methods so as to increase the yield and reduce the cost.

This combining detection circuit for the display panel comprises a plurality of signal contact pads comprising a plurality of gate end contact pads and a plurality of data end contact pads wherein the plurality of scan lines and the plurality of data lines of the panel display are connected to an external detection circuit via the plurality of signal contact pads; a plurality of resistances wherein the plurality of scan lines and the plurality of data lines are connected to a shorting-ring via the plurality of resistances; a plurality of data driver signal lines wherein the plurality of data end contact pads are alternatively connected to the plurality of data driver signal lines via a plurality of conducting wires; a plurality of gate driver signal lines wherein the plurality of gate end contact pads are alternatively connected to the plurality of gate driver signal lines via a plurality of conducting wires; a plurality of switches positioned on the conducting wires for connecting the plurality of signal contact pads and the plurality of data driver signal lines with the plurality of gate driver signal lines

BRIEF DESCRIPTION OF THE DRAWINGS

The accompanying drawings, which are incorporated in and form part of the specification in which like numerals designate like parts, illustrate preferred embodiments of the present invention with the description, and serve to explain the principles of the invention. In the drawings.

DETAILED DESCRIPTION OF THE PREFERRED EMBODIMENT

Presently, as for the display device of the flat panel display and the detection facility before the circuit leaving the factory, the short-ring layout and the shorting-bar layout are included. When performing the initial panel design, it has to be considered which kind of detection facility will be used, and the layout will be limited accordingly. The present invention provides a combining detection circuit for performing the detection independent of the different array detection facilities. Therefore, the correctness of the detection for the shorting-bar layout can be verified before the panel inspection. The present invention not only can promote the maneuverability of the detection facility, but also can reduce the cost.

Figure 1A:
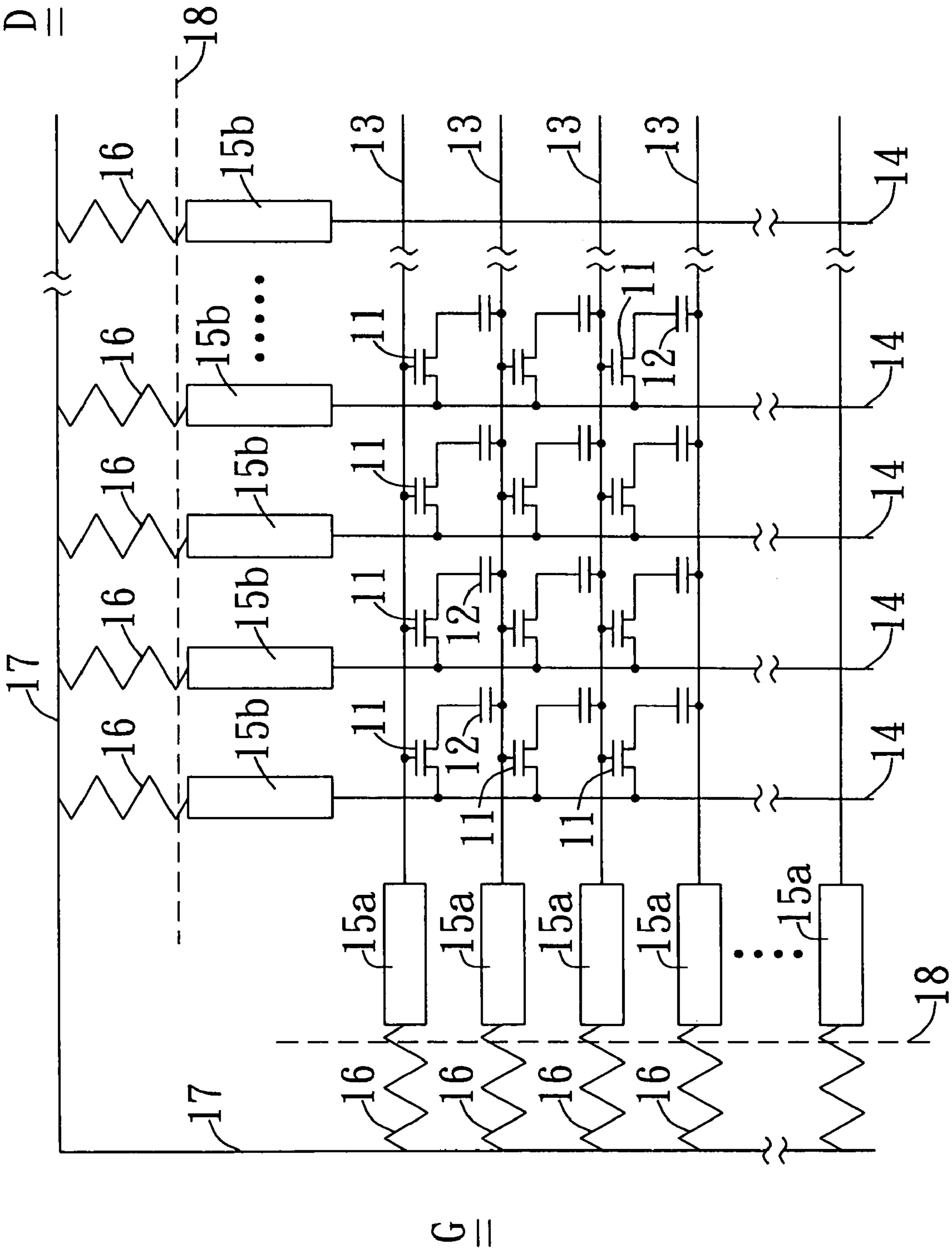
FIG. 1A (PRIOR ART)
FIG. 1A is a perspective diagram of a circuit of a prior art short-ring layout.
Figure 1B:
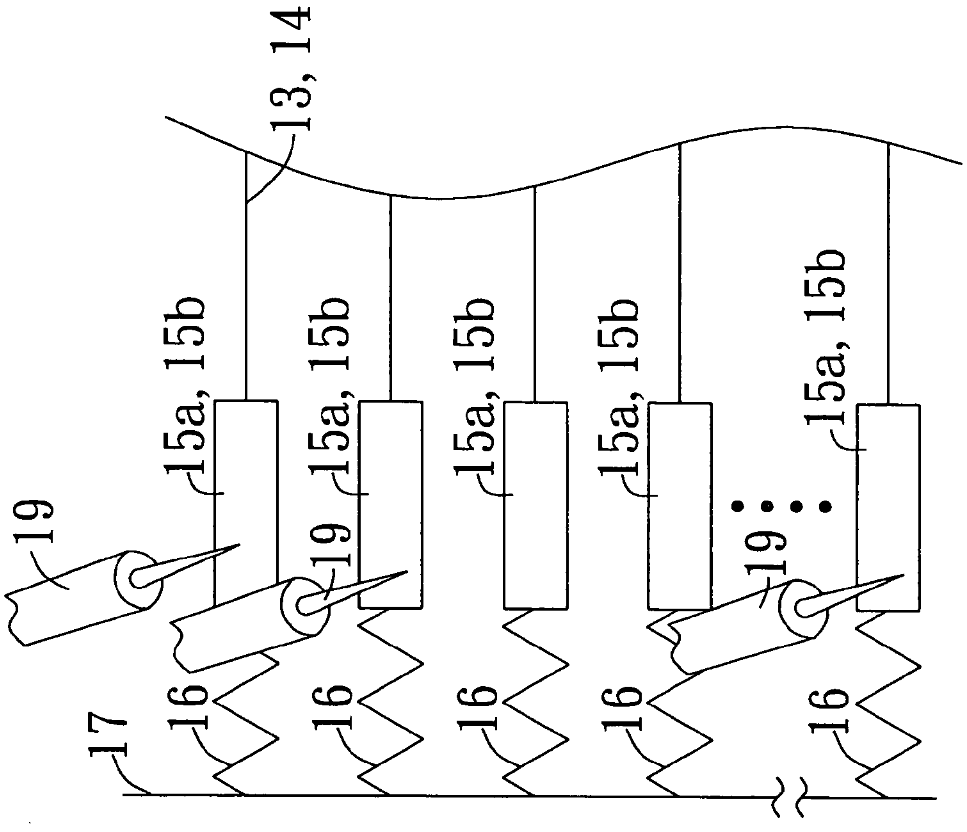
FIG. 1B (PRIOR ART)
FIG. 1B is a perspective diagram of a partial circuit of the prior art short-ring layout.
Figure 2A:
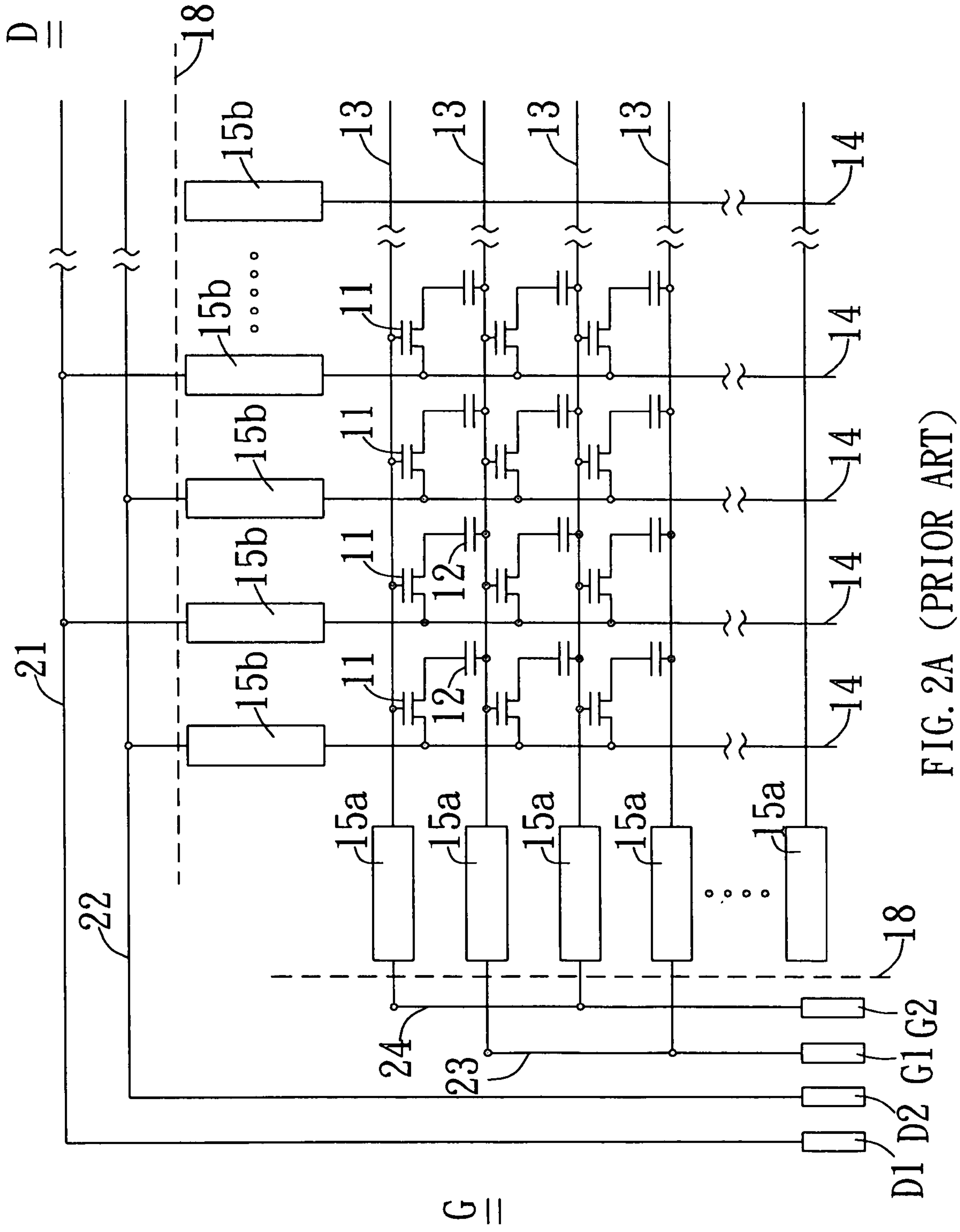
FIG. 2A (PRIOR ART)
FIG. 2A is a perspective diagram of a circuit of a prior art shorting-bar layout.
Figure 2B:
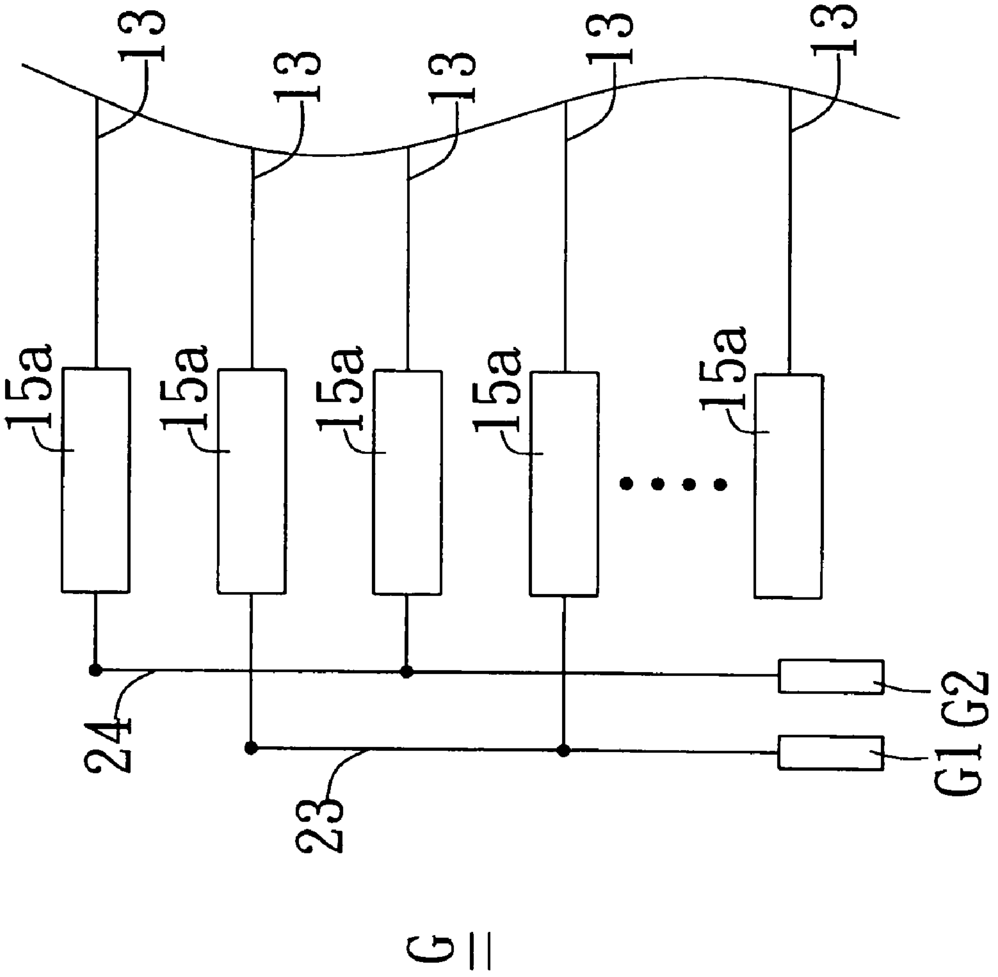
FIG. 2B (PRIOR ART)
FIG. 2B is a perspective diagram of a partial circuit of the prior art shorting-bar layout.
Figure 3A:
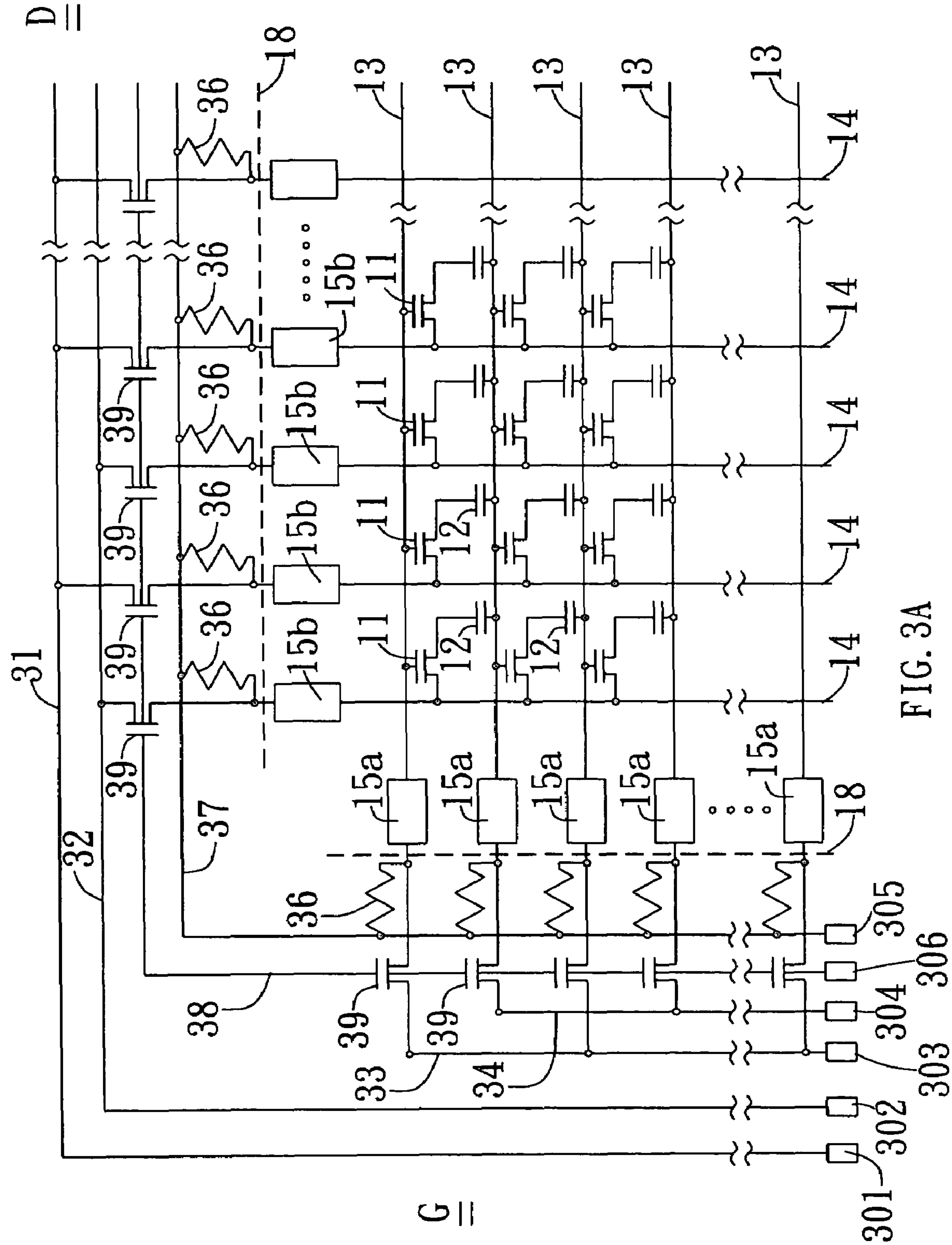
FIG. 3A is a perspective diagram of a combining detection circuit for a display panel according to the present invention.

FIG. 3A is a perspective diagram of a combining detection circuit for a display panel according to the present invention. The figure shows a display device array layout for a liquid crystal display panel. The size of the panel is determined by the size and the resolution. The panel is formed by pulling a plurality of scan lines 13 and data lines 14 from a gate driver G and a data driver D to be interlaced and vertical to each other. The thin film transistors 11 for controlling the pixel display are positioned on the interlaced portions of the scan lines 13 and the data lines 14. The scan lines 13 processes storage capacitances 12. The pixel display is controlled by the charging/discharging of the storage capacitances 12. A plurality of scan lines 13 are connected to a plurality of gate end contact pads 15*a*, and a plurality of data lines 14 are connected to a plurality of data end contact pads 15*b*. Therefore, the plurality of contact pads 15*a*, 15*b* are connected to an external detection circuit.

In order to detect the correctness of the devices connected to the thin film transistors 11 and the layout, the short-ring layout and the shorting-bar layout are combined. As for the gate driver G, a plurality of switch 39 are positioned on the plurality of connecting conducting wires pulled from the gate end contact pads 15*a*. The switches 39 can be transistors. A switch conducting wire end 306 is used for inputting a switch signal to be transmitted to the switch connecting conducting wire 38 and to the switches 39 for switching the detection layout to be the short-ring layout or the shorting-bar layout. The conducting wires connected to the plurality of gate end contact pads 15*a* are connected to a short-ring 37 via a plurality of resistances 36. Therefore, the resistances 36 and the short-ring 37 will conduct the static electricity. The neighboring plurality of gate end contact pads 15*a* are separately connected to the odd gate line 33 and the even gate line 34 via the conducting wires. The switches 39 are used for switching to two detection circuits. The burst electric charges, can be transmitted to short-ring 37 via the resistances 36. The probe can contact with the gate end contact pads 15*a* for detecting the panel pixels, and the detection signal transmitted from the odd gate end 303 and the even gate end 304 can be used for determining whether the operation of the panel is well.

Similarly, as for the data driver D, a plurality of switches 39 are positioned on a plurality of connecting conducting wires pulled from the data end contact pads 15*b*. The switches 39 can be transistors or thin film transistors (TFTs). The switch conducting wire end 306 is used for inputting the switch signal to be transmitted to the switch connecting conducting wire 38 and to the switches 39 for switching the detection layout to be the short-ring layout or the shorting-bar layout. The conducting wires connected to the plurality of data end contact pads 15*b* are connected to a short-ring 37 via the resistances 36, and therefore, the resistances 36 and the short-ring 37 will conduct the static electricity. The neighboring plurality of data end contact pads 15*b* are separately connected to a plurality of data driver signal lines via the conducting wires, comprising the odd data line 31 and the even data line 32. The switches 39 are used for switching to two detection circuits, and the probe can contact the data end contact pads 15*b* for detecting the panel pixels, and the detection signal transmitted from the odd data end 301 and the even data end 302 can be used for determining whether the operation of the panel is well. The gate end contact pads 15*a* of the gate driver G and the data end contact pads 15*b* of the data driver D are commonly connected to the short-ring 37. The neighboring signal polar plates of the gate driver G and the data driver D are alternatively connected to the same odd data line 31 of the plurality of data driver signal lines. The even data line 32 is connected to the alternatively connected signal contact pads of the gate driver G and the data driver D. Similarly, the plurality of gate driver signal lines include the odd gate line 33 and the even gate line 34 which are commonly connected signal lines. The detection circuit using the short-ring layout and the detection circuit using the shorting-bar layout are switched by the plurality of switches 39 via the switch connecting conducting wire 306. After the detection for the panel is accomplished, by cutting along the direction of the panel cutting line 18, the next step of the manufacturing process is continuously performed.

Figure 3B:
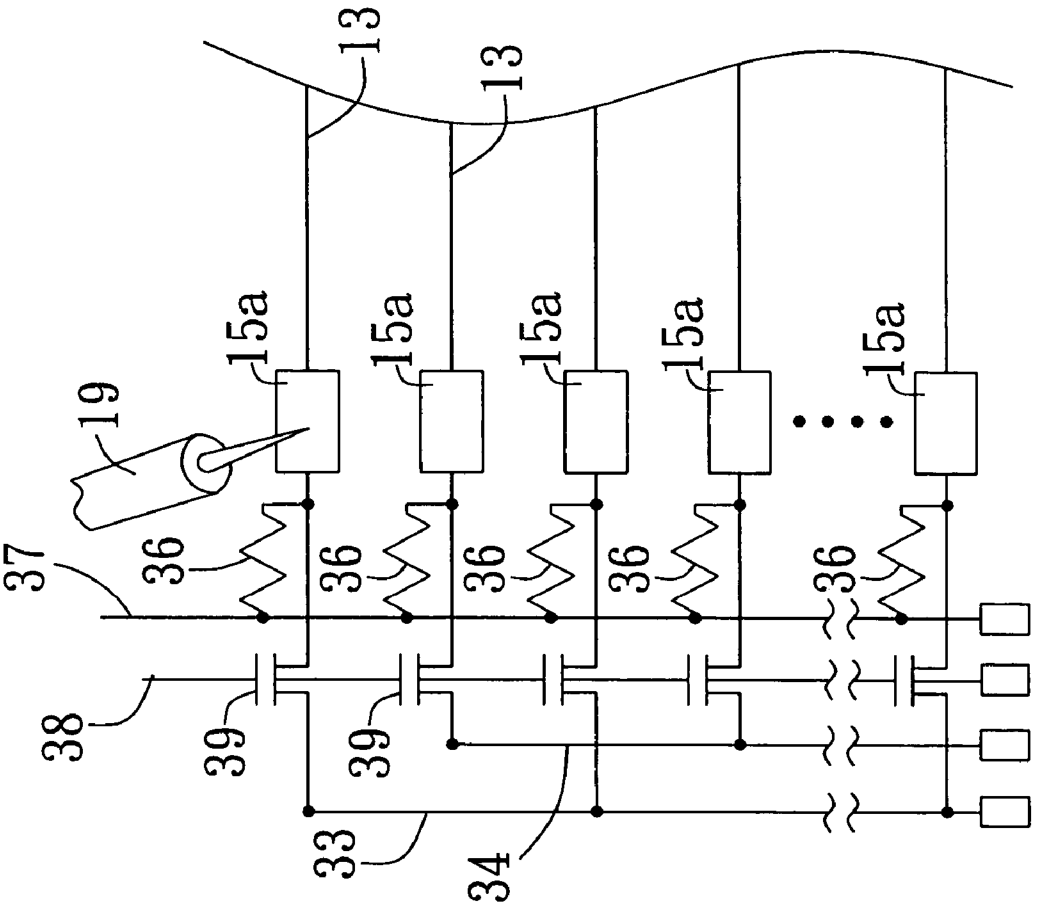
FIG. 3B is a perspective diagram showing a portion of a combining detection gate driver circuit for a display panel according to the present invention.

Please refer to FIG. 3B. FIG. 3B is a perspective diagram showing a portion of a combining detection gate driver circuit for a display panel according to the present invention. This figure shows the partial circuit of the gate driver G. The scan lines 13 are connected to a plurality of gate end contact pads 15*a*. Each of the gate end contact pads 15*a* is connected to two signal lines via the conducting wire. One is connected to the short-ring 37 via the resistance 36, and the other is connected to the odd gate line 33 or the even gate line 34 of the plurality of gate driver signal lines via the switch 39. The two neighboring signal contact pads are alternatively connected to the plurality of signal lines, not limited to the odd gate line 33 and the even gate line 34 shown in this figure. The switch 39 is made of a transistor device to form an electric switch. When the gate of the transistor device is exerted with a high voltage, the transistor device is turned on. The source and the drain are conducted, namely, S-D short. Because of the resistance 36, the signal current is transmitted to the odd gate line 33 via the switch 39 by the signal contact pads. The signal currents of the neighboring signal contact pads are transmitted to the even gate line 34. This status is equivalent to the situation of using the detection circuit of the shorting-bar layout. When the switch 39 is turned off, the switch 39 will interrupt the signal current. This static electricity is transmitted to the short-ring 37 via the resistance 36. So that burst static electricity could be evenly dispersed makes the plurality of probes 19 will contact with the plurality of gate end contact pads 15*a*. This status is equivalent to the detection circuit of the short-ring layout. Therefore, the object of switching to the two detection circuits is achieved by using the mentioned operation method.

Figure 3C:
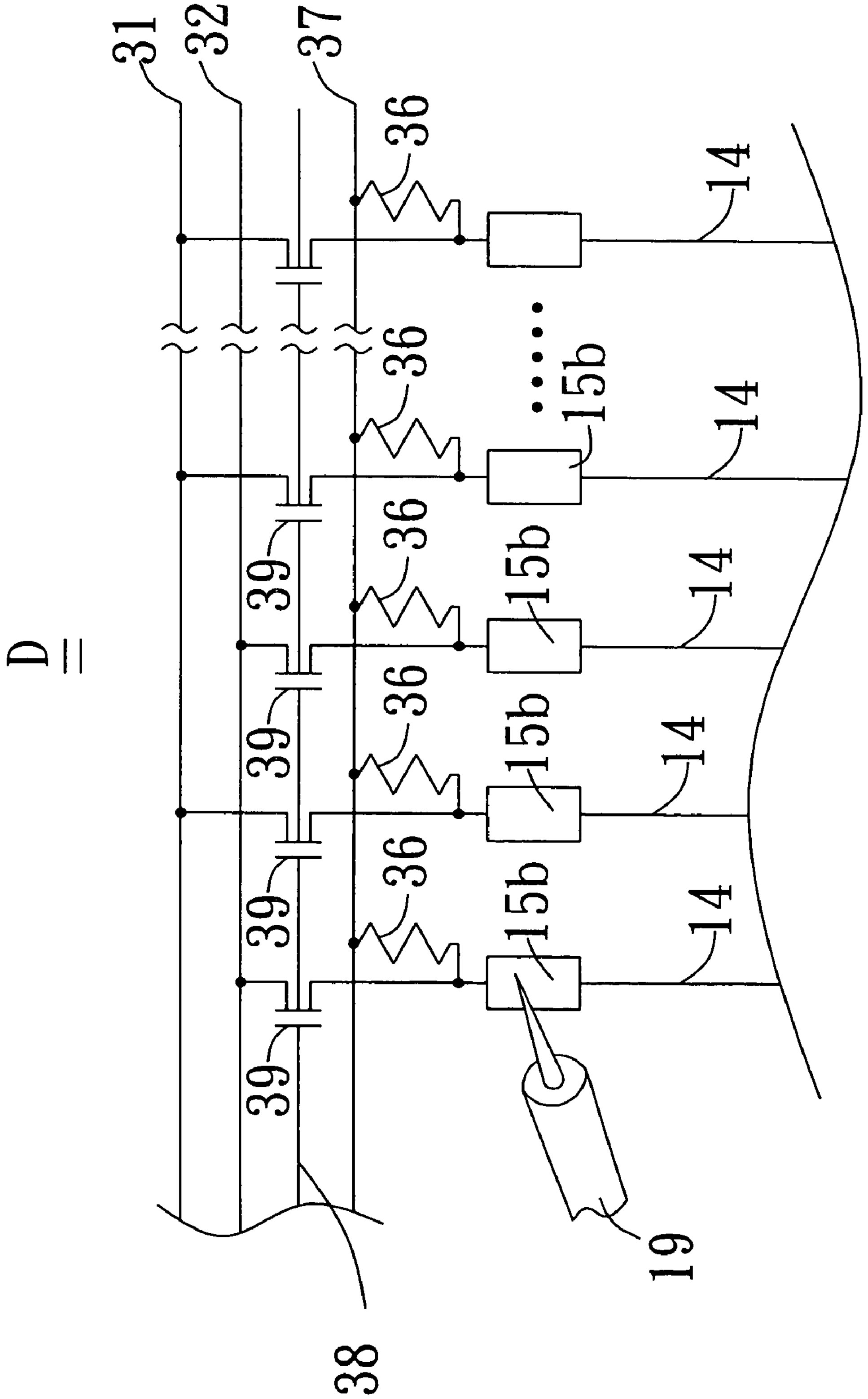
FIG. 3C is a perspective diagram showing a portion of a combining detection data driver circuit for a display panel according to the present invention.

Please refer to FIG. 3C. FIG. 3C is a perspective diagram showing a portion of a combining detection data driver circuit for a display panel according to the present invention. This figure shows the partial circuit of the data driver D. The data lines 14 are connected to a plurality of data end contact pads 15*b*. Each of the data end contact pads 15*b* is connected to two signal lines via the conducting wire. One is connected to the short-ring 37 via the resistance 36, and the other is connected to the odd data line 31 or even data line 32 of the plurality of data driver signal lines via the switch 39. The two neighboring signal contact pads are alternatively connected to a plurality of signal lines, not limited to the embodiment shown in this figure. When the switch 39 is turned on, because of the resistance 36, the signal current is transmitted to the odd data line 31 via the switch 39 by the signal contact pads, and the signal currents of the neighboring signal contact pads are transmitted to the even data line 32. This status is equivalent to the situation of using the detection circuit of the shorting-bar layout. When the switch 39 is turned off, the switch 39 will interrupt the signal current. This static electricity is transmitted to the short-ring 37 via the resistance 36. So that burst static electricity could be evenly dispersed a plurality of probes 19 will contact with the plurality of data end contact pads 15*b*. This status is equivalent to the situation of using the detection circuit of the short-ring layout. Therefore, the object of switching to the two detection circuits is achieved by using the mentioned operation method.

The above is the detailed description of a combining detection circuit for a display panel according to the present invention. The plurality of switches are positioned on the detection circuit of the display panel so as to form a combining detection circuit. The switches are used for switching to different detection facilities so that the designing of the panel circuit is independent of the detection layout and the manufacturing process is not limited. The situation that the detection of one type of layout makes the detection facility of another type of layout idle will not happen. Furthermore, the qualities of the detection facilities can be compared so as to reduce the cost.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A combining detection circuit for a display panel applying a switch installed on the combining detection circuit for switching a short-ring layout and a shorting-bar layout, the combining detection circuit for the display panel comprising:

a plurality of signal contact pads comprising a plurality of gate end contact pads and a plurality of data end contact pads, a plurality of scan lines and a plurality of data lines of the display panel being connected to an external detection circuit via the plurality of signal contact pads;

a plurality of resistances, the plurality of scan lines and the plurality of data lines being connected to a ring signal line via the plurality of resistances;

a plurality of data driver signal lines, the plurality of data end contact pads being alternatively connected to the plurality of data driver signal lines via a plurality of conducting wires;

a plurality of gate driver signal lines, the plurality of gate end contact pads being alternatively connected to the plurality of gate driver signal lines via the plurality of conducting wires;

a plurality of switches positioning on the conducting wires for connecting the plurality of signal contact pads with the plurality of data driver signal lines and the plurality of gate driver signal lines;

wherein the plurality of switches are used for switching the detection signal of the display panel to be transmitted to the ring signal line or the plurality of gate driver signal lines and the plurality of gate driver signal lines.

2. The combining detection circuit of claim 1, wherein the plurality of switches are a plurality of transistors.

3. The combining detection circuit of claim 1, wherein a plurality of switches are connected each other via a connecting conducting wire.

4. The combining detection circuit of claim 1, wherein the ring signal line is connected to a ring signal end.

5. The combining detection circuit of claim 1, wherein the plurality of gate driver signal lines are connected to a plurality of gate ends.

6. The combining detection circuit of claim 1, wherein the plurality of data driver signal lines are connected to a plurality of data ends.

7. The combining detection circuit of claim 3, wherein the ring signal end, the plurality of gate ends and the plurality of data ends are detection ends for the detection signal.

8. The combining detection circuit of claim 1, wherein the plurality of signal contact pads are a plurality of probe contacting contact pads.

9. The combining detection circuit of claim 1, wherein when the plurality of switches are on, a detection circuit with a shorting-bar layout is used; when the plurality of switches are off, a detection circuit with a short-ring layout is used.

* * * * *